(12) United States Patent
Kasuya et al.

(10) Patent No.: US 11,751,321 B2
(45) Date of Patent: Sep. 5, 2023

(54) RESIN MULTILAYER SUBSTRATE

(71) Applicant: Murata Manufacturing Co., Ltd., Nagaokakyo (JP)

(72) Inventors: Atsushi Kasuya, Nagaokakyo (JP); Tomohiko Naruoka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/863,451

(22) Filed: Jul. 13, 2022

(65) Prior Publication Data

US 2022/0346221 A1 Oct. 27, 2022

Related U.S. Application Data

(63) Continuation of application No. PCT/JP2021/007750, filed on Mar. 1, 2021.

(30) Foreign Application Priority Data

Mar. 11, 2020 (JP) .................. 2020-042128

(51) Int. Cl.
*H05K 1/02* (2006.01)
*H05K 1/03* (2006.01)

(52) U.S. Cl.
CPC ......... *H05K 1/0237* (2013.01); *H05K 1/0218* (2013.01); *H05K 1/032* (2013.01);
(Continued)

(58) Field of Classification Search
CPC ............. H05K 1/0271; H05K 1/0217–1/0227
See application file for complete search history.

(56) References Cited

U.S. PATENT DOCUMENTS

2009/0108369 A1   4/2009   Chu
2012/0000695 A1   1/2012   Chisaka
(Continued)

FOREIGN PATENT DOCUMENTS

JP   04-4405 U   1/1992
JP   0786814 A   3/1995
(Continued)

OTHER PUBLICATIONS

International Search Report in PCT/JP2021/007750, dated May 11, 2021, 3 pages.
(Continued)

*Primary Examiner* — Jeremy C Norris
(74) *Attorney, Agent, or Firm* — KEATING & BENNETT, LLP (57) ABSTRACT

A resin multilayer substrate includes a multilayer body including resin base-material layers in a thickness direction, a side-surface conductor on at least a side surface of the multilayer body and made of a metallic material with a coefficient of thermal expansion whose difference from a coefficient of thermal expansion of the resin base-material layers in a plane direction is smaller than a difference from a coefficient of thermal expansion of the resin base-material layers in the thickness direction, a circuit component in the multilayer body and defining a circuit, and inner conductors in the multilayer body, located between the side-surface conductor and the circuit component along the side-surface conductor, and at least partially overlapping each other when viewed in the thickness direction, each of the inner conductors being one of a dummy conductor and a ground conductor.

17 Claims, 4 Drawing Sheets

(52) U.S. Cl.
CPC .............. *H05K 2201/0141* (2013.01); *H05K 2201/068* (2013.01); *H05K 2201/09027* (2013.01)

(56) References Cited

U.S. PATENT DOCUMENTS

2017/0188459 A1    6/2017  Yosui et al.
2019/0035716 A1    1/2019  Kita

FOREIGN PATENT DOCUMENTS

| JP | 2000269616 A | 9/2000 |
|----|--------------|--------|
| JP | 2003304072 A | 10/2003 |
| JP | 2013-0898411 A | 5/2013 |
| WO | 2010103940 A1 | 9/2010 |
| WO | 2016031691 A1 | 3/2016 |
| WO | 2017170535 A1 | 10/2017 |

OTHER PUBLICATIONS

Written Opinion in PCT/JP2021/007750, dated May 11, 2021, 4 pages.
Official Communication issued in corresponding Japanese Patent Application No. 2022-505930, dated Jun. 27, 2023.

RESIN MULTILAYER SUBSTRATE

CROSS REFERENCE TO RELATED APPLICATIONS

This application claims the benefit of priority to Japanese Patent Application No. 2020-042128 filed on Mar. 11, 2020 and is a Continuation Application of PCT Application No. PCT/JP2021/007750 filed on Mar. 1, 2021. The entire contents of each application are hereby incorporated herein by reference.

BACKGROUND OF THE INVENTION

1. Field of the Invention

The present invention relates to a resin multilayer substrate including a plurality of laminated resin base-material layers.

2. Description of the Related Art

For example, International Publication No. 2016/031691 discloses a resin multilayer substrate formed by laminating a plurality of sheet-shaped resin base-material layers. A side-surface conductor is formed on a side surface of the resin multilayer substrate.

In many cases, each of the plurality of resin base-material layers of the resin multilayer substrate as described in International Publication No. 2016/031691 has a different coefficient of thermal expansion in a thickness direction (lamination direction) and in a plane direction. In the resin multilayer substrate described in International Publication No. 2016/031691, when the coefficient of thermal expansion of the resin base-material layer in the thickness direction is higher than that of the side-surface conductor, a portion of each of the plurality of resin base-material layers near the side-surface conductor may thermally expand in the thickness direction. As a result, there is a possibility of the side-surface conductor peeling from the side surface.

SUMMARY OF THE INVENTION

Preferred embodiments of the present invention provide resin multilayer substrates each including a plurality of laminated resin base-material layers and a side-surface conductor on a side surface thereof, which are each able to reduce or prevent peeling of the side-surface conductor from the side surface due to thermal expansion of the resin base-material layer.

A resin multilayer substrate according to a preferred embodiment of the present invention includes a multilayer body including a plurality of resin base-material layers laminated in a thickness direction, a side-surface conductor on at least a portion of a side surface of the multilayer body and made of a metallic material with a coefficient of thermal expansion whose difference from a coefficient of thermal expansion of the resin base-material layers in a plane direction is smaller than a difference from a coefficient of thermal expansion of the resin base-material layers in the thickness direction, a circuit component in the multilayer body and defining a circuit, and a plurality of inner conductors in the multilayer body and located between the side-surface conductor and the circuit component along the side-surface conductor and at least partially overlapping each other when viewed in the thickness direction, each of the inner conductors being one of a dummy conductor and a ground conductor.

According to preferred embodiments of the present invention, in each of resin multilayer substrates including a plurality of resin base-material layers that are laminated and a side-surface conductor on a side surface thereof, peeling of the side-surface conductor from the side surface due to the thermal expansion of the resin base-material layer is able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A resin multilayer substrate according to a preferred embodiment of the present invention includes a multilayer body including a plurality of resin base-material layers laminated in a thickness direction, a side-surface conductor on at least a portion of a side surface of the multilayer body and made of a metallic material with a coefficient of thermal expansion whose difference from a coefficient of thermal expansion of the resin base-material layers in a plane direction is smaller than a difference from a coefficient of thermal expansion of the resin base-material layers in the thickness direction, a circuit component in the multilayer body and defining a circuit, and a plurality of inner conductors in the multilayer body and located between the side-surface conductor and the circuit component along the side-surface conductor and at least partially overlapping each other when viewed in the thickness direction, each of the inner conductors being one of a dummy conductor and a ground conductor.

According to the above-described preferred embodiment, in the resin multilayer substrate including the plurality of resin base-material layers and the side-surface conductor on the side surface thereof, peeling of the side-surface conductor from the side surface due to the thermal expansion of the resin base-material layer can be reduced or prevented.

For example, in a direction in which the inner conductors opposes the side-surface conductor, a distance between the inner conductors and the side-surface conductor may be smaller than the size of the inner conductor.

For example, the plurality of inner conductors may be arranged plane-symmetrically with respect to a plane parallel or substantially parallel to the plane direction and passing through the center or approximate center of the multilayer body in the thickness direction.

For example, the resin multilayer substrate may include an end-surface conductor provided on at least one of end surfaces of the multilayer body in the thickness direction and connected to the side-surface conductor.

For example, among the plurality of inner conductors, the thickness of an inner conductor closest to the end-surface conductor may be larger than the thickness of another inner conductor.

For example, the total thickness of the plurality of inner conductors may be larger than the total thickness of the resin base-material layers in a portion opposing the inner conductors in the thickness direction.

For example, the multilayer body may include an adhesive layer located between resin base-material layers adjacent to each other and includes a fluoropolymer.

For example, the resin base-material layers may be made of a thermoplastic resin including a liquid crystal polymer resin.

For example, the circuit may be a high-frequency circuit.

Preferred embodiments of the present invention are described below with reference to the drawings.

Preferred Embodiment 1

Figure 1:
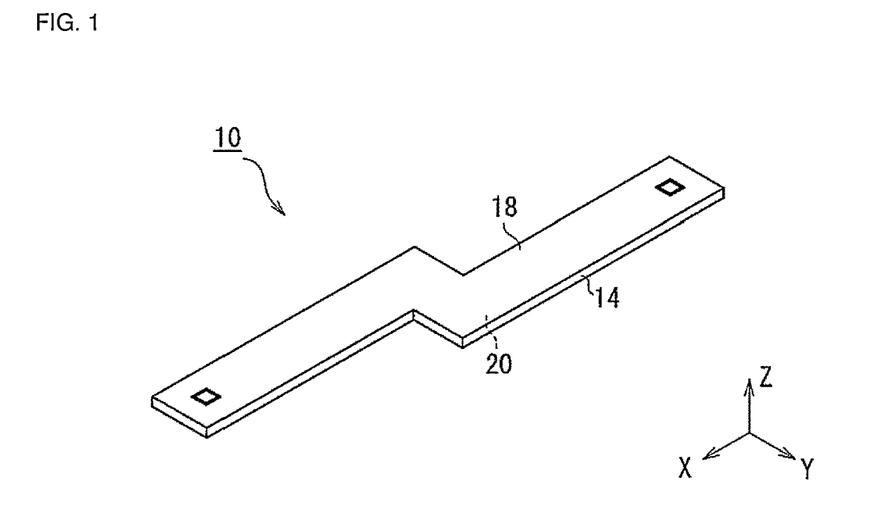
FIG. 1 is a perspective view of a resin multilayer substrate according to Preferred Embodiment 1 of the present invention.
Figure 2:
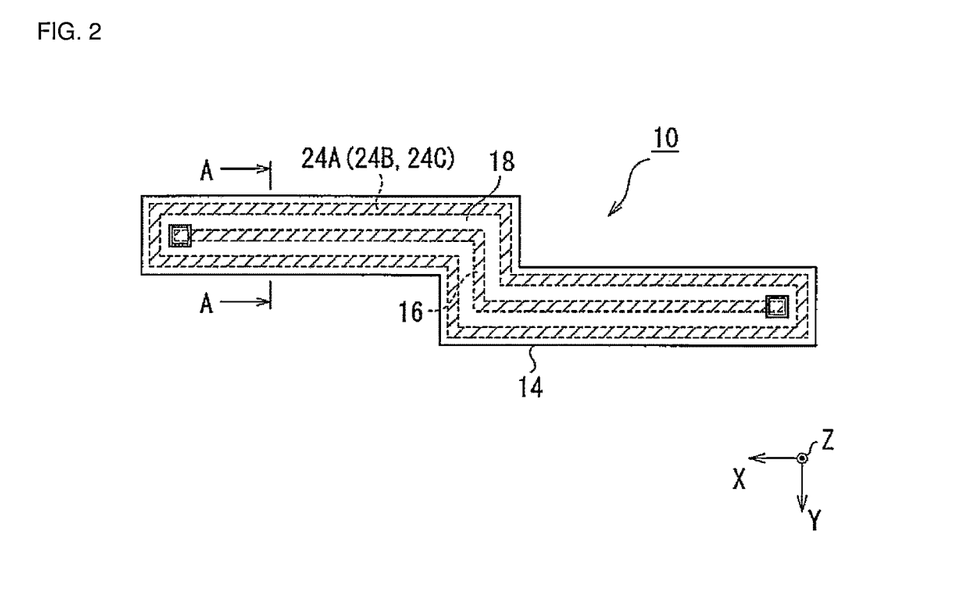
FIG. 2 is a top view of the resin multilayer substrate according to Preferred Embodiment 1 of the present invention.
Figure 3:
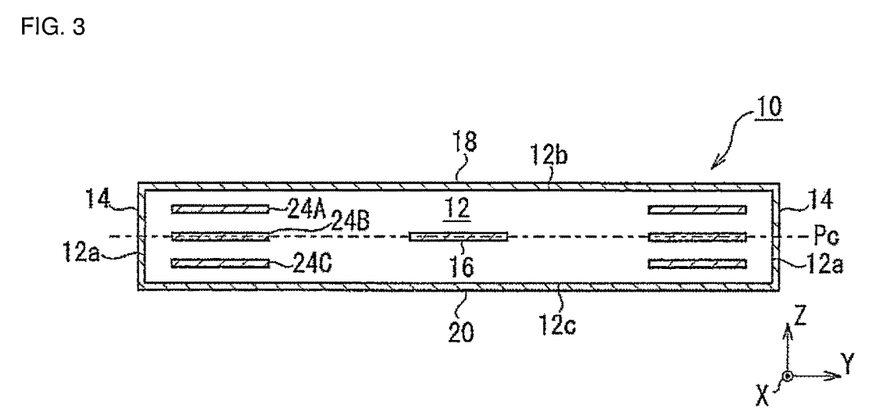
FIG. 3 is a sectional view of the resin multilayer substrate taken along line A-A illustrated in FIG. 2.

FIG. 1 is a perspective view of a resin multilayer substrate according to Preferred Embodiment 1 of the present invention. Further, FIG. 2 is a top view of the resin multilayer substrate. Furthermore, FIG. 3 is a sectional view of the resin multilayer substrate taken along line A-A illustrated in FIG. 2. The X-Y-Z rectangular coordinate system illustrated in the drawings is to facilitate understanding of preferred embodiments of the present invention and is not to limit the present invention. Moreover, an X-axis direction and a Y-axis direction as used herein indicate a plane direction, and a Z-axis direction indicates a thickness direction.

As illustrated in FIGS. 1 to 3, a resin multilayer substrate 10 according to Preferred Embodiment 1 includes a multilayer body 12, a side-surface conductor 14 provided on a side surface 12a of the multilayer body 12, a circuit conductor 16 which is a circuit component provided in the multilayer body 12 and defining a circuit, and end-surface conductors 18 and 20 respectively provided on both end surfaces 12b and 12c of the multilayer body 12 in the thickness direction (Z-axis direction).

The multilayer body 12 of the resin multilayer substrate is a multilayer body including a plurality of resin base-material layers that are laminated.

Figure 4:
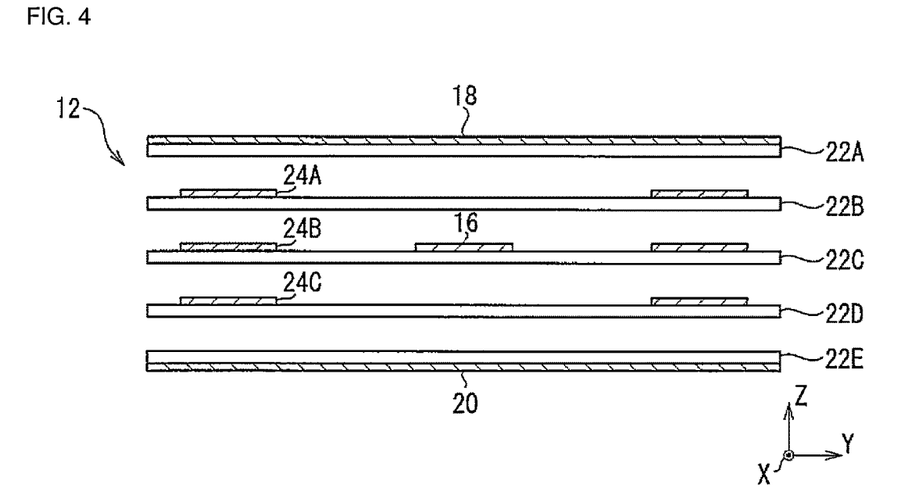
FIG. 4 is a sectional view of a plurality of resin base-material layers of a multilayer body according to Preferred Embodiment 1 of the present invention.

FIG. 4 is a sectional view of the plurality of resin base-material layers of the multilayer body.

As illustrated in FIG. 4, the multilayer body 12 of the resin multilayer substrate 10 is formed by laminating a plurality of sheet-shaped resin base-material layers 22A to 22E in the thickness direction (Z-axis direction). In Preferred Embodiment 1, the resin base-material layers 22A to 22E are made of, for example, a thermoplastic resin whose main raw material is a liquid crystal polymer resin. The resin base-material layers 22A to 22E may have the same or substantially the same thickness or different thicknesses.

In Preferred Embodiment 1, the multilayer body 12 is formed by the plurality of resin base-material layers 22A to 22E being stacked in the thickness direction (Z-axis direction) and pressed in the thickness direction while heated. That is, the multilayer body 12 is formed by the resin base-material layers being thermally pressure-bonded directly to each other.

Further, each of the plurality of resin base-material layers 22A to 22E is provided with a conductor made of, for example, copper foil.

Among the plurality of resin base-material layers 22A to 22E, the resin base-material layers 22A and 22E located at outer side portions in the thickness direction (Z-axis direction) are each provided with the end-surface conductor 18 or 20 on the entire or substantially the entire one end surface thereof in the thickness direction (Z-axis direction). Among the plurality of resin base-material layers 22A to 22E, the resin base-material layer 22C located at the center or approximate center in the thickness direction is provided with the circuit conductor 16. In Preferred Embodiment 1, the circuit conductor 16 is a signal line which transmits high-frequency signals, and, as illustrated in FIG. 3, the circuit conductor 16 is located between the end-surface conductors 18 and 20 so as to define and function as a stripline. The circuit conductor 16 is formed by, for example, patterning by etching copper foil provided over the entire or substantially the entire one end surface of the resin base-material layer 22C in the thickness direction.

Further, as illustrated in FIG. 3, the side-surface conductor 14 is provided on the side surface 12a of the multilayer body 12 (on a surface intersecting the direction (X-axis and Y-axis directions) orthogonal or substantially orthogonal to the thickness direction (Z-axis direction)). In Preferred Embodiment 1, as illustrated in FIG. 2, the side-surface conductor 14 is provided over the entire or substantially the entire side surface 12a of the multilayer body 12. Moreover, the side-surface conductor 14 is connected to the end-surface conductors 18 and 20. Such a side-surface conductor 14 is made through film-forming processing, such as sputtering, for example.

Figure 5:
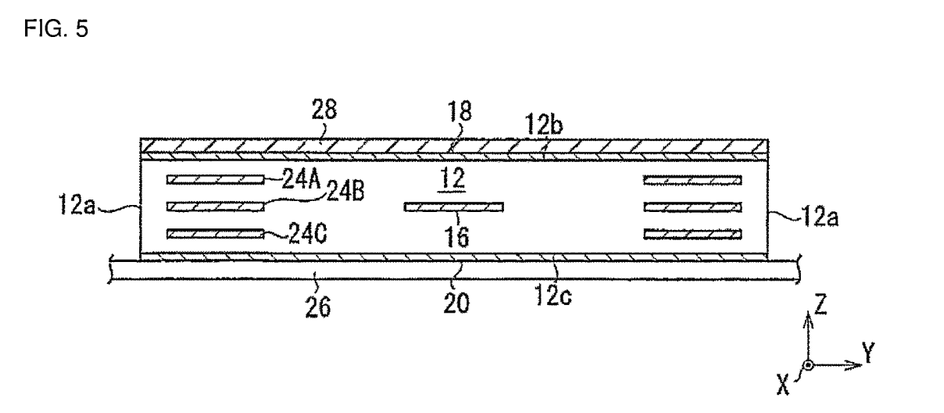
FIG. 5 is a sectional view of the multilayer body before being provided with a side-surface conductor.

FIG. 5 is a sectional view of the multilayer body before being provided with the side-surface conductor.

As illustrated in FIG. 5, the multilayer body 12 is provided on a carrier film 26 using, for example, a pressure-sensitive adhesive. Next, a resist layer 28 is formed on the end-surface conductor 18 of the multilayer body 12. Then, the side-surface conductor 14 is formed on the side surface 12a of the multilayer body 12 through, for example, sputtering on the multilayer body 12 by using, for example, a copper target. This side-surface conductor 14 defines and functions as a shield which prevents electromagnetic waves from radiating to the outside from the circuit (circuit conductor) in the multilayer body 12. The resist layer 28 may be removed or retained. If the resist layer is retained, since the resist layer 28 opposes the circuit conductor 16 with the end-surface conductor 18 in between, the high-frequency characteristics of the circuit conductor 16 are not adversely affected.

Moreover, as illustrated in FIG. 3, inner conductors 24A to 24C different from the circuit conductor 16 defining the circuit are provided in the multilayer body 12.

Each of the inner conductors 24A to 24C is a dummy conductor and is provided in the multilayer body 12 so as to be located between the side-surface conductor 14 and the circuit conductor 16 as illustrated in FIGS. 2 and 3. The inner conductors 24A to 24C are copper foil, for example. Further, each of the inner conductors 24A to 24C is provided in the multilayer body 12 along the side-surface conductor 14 as illustrated in FIG. 2. Moreover, the inner conductors 24A to 24C are provided in the multilayer body 12 so as to at least partially overlap each other when viewed in the thickness direction (Z-axis direction).

In Preferred Embodiment 1, as illustrated in FIG. 4, the inner conductors 24A to 24C are respectively provided on the resin base-material layers 22B to 22D. The inner conductors 24A to 24C are made by, for example, patterning by etching copper foil provided over the entire or substantially the entire one end surfaces of the resin base-material layers 22B to 22D in the thickness direction (Z-axis direction), respectively.

Reasons for providing such inner conductors 24A to 24C in the multilayer body 12 are described below.

As illustrated in FIG. 4, the multilayer body 12 is formed by laminating the plurality of sheet-shaped resin base-material layers 22A to 22E. In such resin base-material layers 22A to 22E, a coefficient of thermal expansion in the thickness direction (Z-axis direction) is different from a coefficient of thermal expansion in the plane direction (X-axis direction and Y-axis direction). For example, the coefficient of thermal expansion in the thickness direction is higher than that in the plane direction.

The "coefficient of thermal expansion in the thickness direction" of the resin base-material layer can be obtained by using, for example, laser interferometry. An interference fringe caused by laser light reflected on reflectors is captured while changing a temperature condition. The reflectors sandwich the base-material layer in the thickness direction. Since a change in the interference fringe has a correspondence with the change in the thickness direction, the change in the base-material layer in the thickness direction due to the temperature change, that is, the "coefficient of thermal expansion in the thickness direction" can be calculated based on the change in the interference fringe due to the temperature change. Further, the "coefficient of thermal expansion in the thickness direction" may be calculated through similar measuring using the multilayer body where the base-material layers are laminated, without removing a single base-material layer. At this time, the measuring itself is performed on a portion of the multilayer body as a measurement range, the portion being in a pure state without a protective layer (for example, a resist layer) on a surface thereof and without a conductor on the surface or inside thereof.

Further, the "coefficient of thermal expansion in the plane direction" of the resin base-material layer can be obtained by using, for example, a thermo mechanical analysis (TMA) method. An amount of change in the resin base-material layer in the plane direction is measured while changing a temperature condition in a state where a constant tensile stress is applied in the plane direction. Accordingly, the change in the resin base-material layer in the plane direction due to the temperature change, that is, the "coefficient of thermal expansion in the plane direction" can be calculated. Further, the "coefficient of thermal expansion in the plane direction" may be calculated through similar measuring using the multilayer body where the base-material layers are laminated, without removing a single base-material layer. At this time, the measuring itself is performed on a portion of the multilayer body as a measurement range, the portion being in a pure state without a protective layer (for example, a resist layer) on a surface thereof and without a conductor on the surface or inside thereof.

As a result of such aeolotropy of the resin base-material layer on the coefficient of thermal expansion, the plurality of resin base-material layers 22A to 22E, that is, the multilayer body 12, thermally expand more in the thickness direction (Z-axis direction) than in the plane direction (X-axis direction and Y-axis direction) when in a high-temperature state due to generation of heat by the circuit conductor 16 which transmits signals.

At this time, when the side-surface conductor 14 is made of the metallic material with a coefficient of thermal expansion whose difference from the coefficient of thermal expansion of the resin base-material layers in the plane direction (X-axis direction and Y-axis direction) is smaller than a difference from that of the resin base-material layers in the thickness direction (Z-axis direction), the side-surface conductor 14 may peel. For example, when the metallic material of the side-surface conductor is copper, the coefficient of thermal expansion thereof is approximately 17 ppm. On the other hand, when the resin base-material layers is made of a liquid crystal polymer resin, the coefficient of thermal expansion in the plane direction is approximately 16 ppm, and the coefficient of thermal expansion in the thickness direction is approximately 300 ppm. In this case, when large thermal expansion in the thickness direction occurs in a range near the side surface 12a of the multilayer body 12, it is possible that the side surface 12a largely deforms and the side-surface conductor 14 on the side surface 12a peels since the side-surface conductor 14 cannot deform to the same or similar extent. Further, in Preferred Embodiment 1, a crack may occur at the connection portions between the side-surface conductor 14 and the end-surface conductors 18 and 20.

In order to reduce or prevent the thermal expansion near the side surface 12a of such a multilayer body 12, the inner conductors 24A to 24C are provided in the multilayer body 12 so as to be located between the side-surface conductor 14 and the circuit conductor 16 and along the side-surface conductor 14. Further, the inner conductors 24A to 24C are provided in the multilayer body 12 so as to at least partially overlap each other when viewed in the thickness direction (Z-axis direction).

As a result of such an arrangement of the inner conductors 24A to 24C, in the range of the multilayer body 12 near the side surface 12a provided with the side-surface conductor 14, a volume fraction of the conductor increases while a volume fraction of the resin decreases (compared with a case without the inner conductors 24A to 24C). Therefore, in this range, an amount of heat conducted to the resin base-material layer is reduced, and the thermal expansion of the resin base-material layer in the thickness direction (Z-axis direction) can be reduced or prevented. That is, the thermal expansion of the multilayer body 12 in the thickness direction (Z-axis direction) can be reduced or prevented. As a result, deformation of the side surface 12a of the multilayer body 12 is reduced or prevented, and thus the exfoliation of the side-surface conductor 14 from the side surface 12a and the generation of a crack at the connection portions between the side-surface conductor 14 and the end-surface conductors 18 and 20 are reduced or prevented.

Regarding the end-surface conductors 18 and 20, peeling from the multilayer body 12 due to a difference in a coefficient of thermal expansion thereof from that of the resin base-material layer does not substantially occur. This is because the difference between the coefficient of thermal expansion of the metallic material of the end-surface conductors 18 and 20 and the coefficient of thermal expansion of the resin base-material layer in the plane direction is small. For example, when the resin base-material layer is made of a thermoplastic resin whose main raw material is a liquid crystal polymer resin, the coefficient of thermal expansion in the plane direction (X-axis direction and Y-axis direction) is approximately 16 ppm, which is the same or substantially the same as the coefficient of thermal expansion (approximately 17 ppm) of copper which is the material of the end-surface conductors 18 and 20.

That is, peeling of the end-surface conductors 18 and 20 is reduced or prevented compared with peeling of the side-surface conductor 14. A reason for this priority is that the end-surface conductors 18 and 20 oppose the circuit conductor 16 at a closer distance and a larger area opposing thereto compared with the side-surface conductor 14. Then, if such end-surface conductors 18 and peel, the high-frequency characteristics of the circuit conductor 16 are largely changed.

In a direction (Y-axis direction) in which the inner conductors 24A to 24C oppose the side-surface conductor 14, the distance between the inner conductor and the side-surface conductor is preferably small and more preferably smaller than at least the size (the width) of the inner conductor. However, the inner conductors 24A to 24C are not exposed to the outside through the side surface 12a of the multilayer body 12. When the inner conductors 24A to 24C are exposed to the outside, the resin base-material layers adjacent to each other with the inner conductor therebetween easily peel from each other.

Further, each of the inner conductors 24A to 24C preferably has a large width (the size in the direction opposing the side-surface conductor 14 (Y-axis direction)), and the area of overlap in the thickness direction (Z-axis direction) is preferably large. Accordingly, if any of the resin base-material layers are misaligned in the plane direction when the plurality of resin base-material layers 22A to 22E are heated and pressed, the inner conductors 24A to 24C can overlap each other in the thickness direction with certainty.

Figure 6:
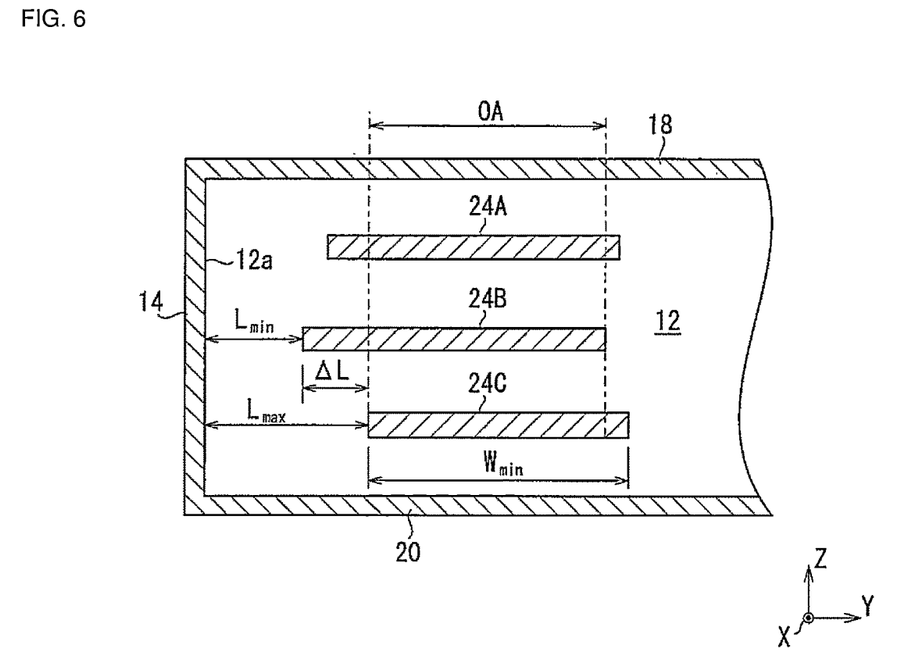
FIG. 6 is an enlarged sectional view of the resin multilayer substrate near the side-surface conductor and illustrates parameters related to an inner conductor.

FIG. 6 is an enlarged sectional view of the resin multilayer substrate near the side-surface conductor and illustrates parameters related to the inner conductor.

As illustrated in FIG. 6, a distance $L_{min}$ between the inner conductor closest to the side-surface conductor 14 and the side-surface conductor 14 is preferably small and more preferably smaller than at least a smallest width (the size in the direction in which the inner conductor opposes the side-surface conductor 14 (Y-axis direction)) $W_{min}$ of the plurality of inner conductors 24A to 24C. In contrast, if the distance $L_{min}$ is larger than the width $W_{min}$, since the range between the inner conductors and the side-surface conductor 14 increases, the effect of the inner conductors suppressing the thermal expansion of the multilayer body 12 in the range near the side surface 12a provided with the side-surface conductor 14 is weakened.

Further, a difference in distance ΔL between a distance $L_{max}$ and the distance $L_{min}$ is preferably small and more preferably smaller than at least the smallest width $W_{min}$ of the inner conductors. Here, the distance $L_{max}$ is a distance between the inner conductor farthest from the side-surface conductor 14 and the side-surface conductor 14, and the distance $L_{min}$ is a distance between the inner conductor closest to the side-surface conductor 14 and the side-surface conductor 14. In contrast, if the difference in distance ΔL is larger than the smallest width $W_{min}$, an amount of overlap OA of the inner conductors decreases, and the effect of the inner conductors suppressing the thermal expansion of the multilayer body 12 in the range near the side surface 12a is weakened. The difference in distance ΔL may be larger than the smallest distance $L_{min}$.

That is, the plurality of inner conductors 24A to 24C are preferably provided in the multilayer body 12 so that the smallest distance $L_{min}$ from the side-surface conductor 14, the difference in distance ΔL, and the smallest width $W_{min}$ satisfy the relation indicated by Formula 1.

$$W_{min} > \Delta L > L_{min} \tag{1}$$

Further, as illustrated in FIG. 3, the plurality of inner conductors 24A to 24C are preferably arranged plane-symmetrically with respect to a plane Pc parallel or substantially parallel to the plane direction (X-axis direction and Y-axis direction) and passing through the center or approximate center of the multilayer body 12 in the thickness direction (Z-axis direction). Accordingly, in the range of the multilayer body 12 near the side-surface conductor 14, the thermal expansion can uniformly or substantially uniformly be reduced or prevented in the thickness direction. As a result, it is possible to reduce or prevent the side surface 12a provided with the side-surface conductor 14 from deforming locally and the side-surface conductor 14 from starting to peel from the locally deformed part of the side surface 12a.

As illustrated in FIG. 2, each of the plurality of inner conductors 24A to 24C is continuously provided along the entire or substantially the entire side-surface conductor 14. However, the preferred embodiments of the present invention are not limited to this.

Figure 7:
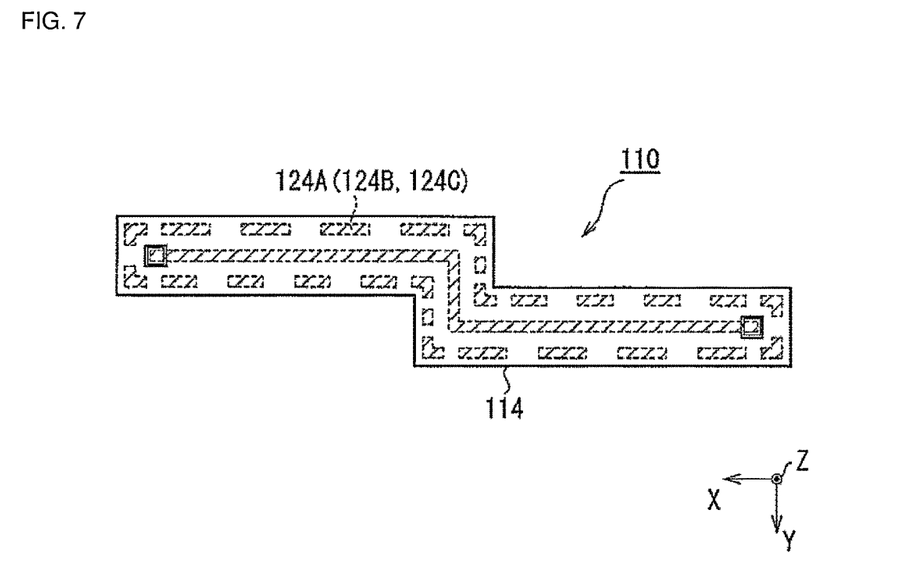
FIG. 7 is a top view of a resin multilayer substrate according to a modification of Preferred Embodiment 1 of the present invention.

FIG. 7 is a top view of a resin multilayer substrate according to a modification of Preferred Embodiment 1 of the present invention.

As illustrated in FIG. 7, in a resin multilayer substrate 110 according to the modification of Preferred Embodiment 1, a plurality of inner conductors 124A to 124C are intermittently provided along the entire or substantially the entire side-surface conductor 114 while overlapping each other in the thickness direction (Z-axis direction).

Further, as illustrated in FIG. 3, the plurality of inner conductors 24A to 24C of the resin multilayer substrate 10 are dummy conductors which are not substantially involved in the signals transmitted through the circuit conductor 16, as illustrated in FIG. 3. However, the preferred embodiments of the present invention are not limited to this.

Figure 8:
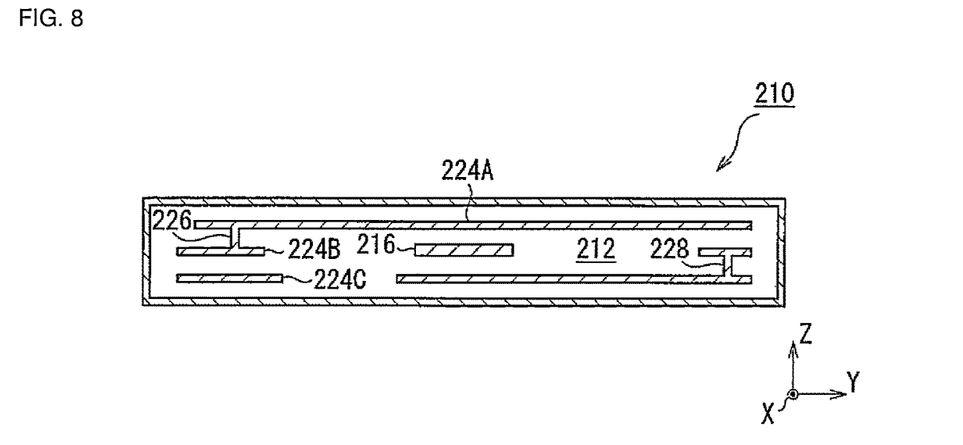
FIG. 8 is a sectional view of a resin multilayer substrate according to another modification of Preferred Embodiment 1 of the present invention.

FIG. 8 is a sectional view of a resin multilayer substrate according to another modification of Preferred Embodiment 1 of the present invention.

As illustrated in FIG. 8, in a resin multilayer substrate 210 according to the present modification of Preferred Embodiment 1, a plurality of inner conductors 224A to 224C are ground conductors which are involved in signals (for example, high-frequency signals) transmitted through a circuit conductor 216. Further, the inner conductors 224A and 224B are connected to each other through an interlayer connection conductor 226, and the inner conductors 224B and 224C are connected to each other through an interlayer connection conductor 228. The interlayer connection conductors 226 and 228 are, for example, through-hole conductors penetrating the resin base-material layers provided with the inner conductors 224A and 224B, respectively.

In Preferred Embodiment 1 as described above, in the resin multilayer substrate 10 which is formed by laminating the plurality of resin base-material layers 22A to 22E and includes the side-surface conductor 14 on the side surface 12a of the multilayer body 12, peeling of the side-surface conductor 14 from the side surface 12a due to the thermal expansion of the resin base-material layers 22A to 22E can be reduced or prevented.

Moreover, in Preferred Embodiment 1, generation of a crack at the connection portions between the side-surface conductor 14 and the end-surface conductors 18 and 20 can be reduced or prevented.

Preferred Embodiment 2

Preferred Embodiment 2 of the present invention is the same or substantially the same as Preferred Embodiment 1 described above, except for the inner conductors. Therefore, Preferred Embodiment 2 will be described focusing on the different points.

Figure 9:
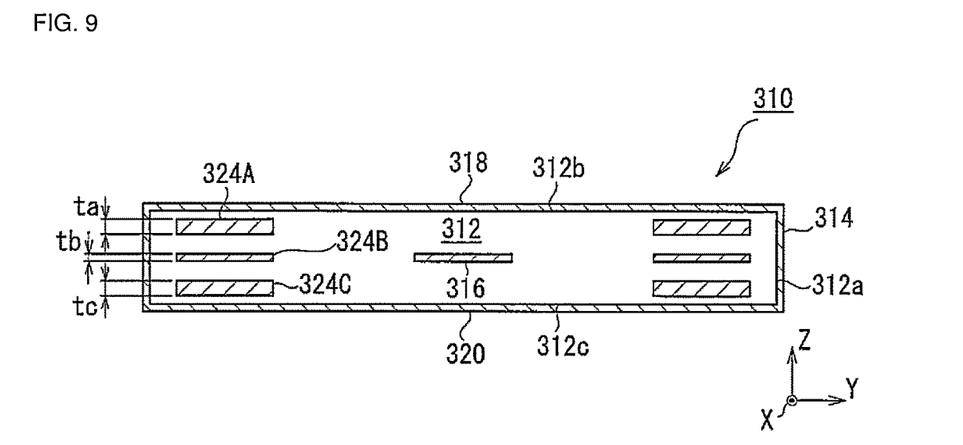
FIG. 9 is a sectional view of a resin multilayer substrate according to Preferred Embodiment 2 of the present invention.

FIG. 9 is a sectional view of a resin multilayer substrate according to Preferred Embodiment 2 of the present invention.

As illustrated in FIG. 9, a resin multilayer substrate 310 according to Preferred Embodiment 2 includes a multilayer body 312 formed by laminating a plurality of resin base-material layers, a side-surface conductor 314 provided on a side surface 312a of the multilayer body 312, a circuit conductor 316 provided in the multilayer body 312 and defining a circuit, and end-surface conductors 318 and 320 respectively provided on both end surfaces 312b and 312c of the multilayer body 312 in the thickness direction (Z-axis direction).

Inner conductors 324A to 324C different from the circuit conductor 316 are provided in the multilayer body 312.

Among the plurality of inner conductors 324A to 324C, thicknesses ta and tc of the inner conductors 324A and 324C closest to the end-surface conductors 318 and 320, respectively, are larger than a thickness tb of the other inner conductor 324B. Therefore, in a range of the multilayer body 312 near the side-surface conductor 314, the volume fraction of the resin (resin base-material layers) decreases approaching the end-surface conductors 318 and 320. Accordingly, thermal expansion of the multilayer body 312 in the range near the end-surface conductors 318 and 320 can be reduced compared with thermal expansion in a range separated from the end-surface conductors 318 and 320. As a result, generation of a crack at connection portions between the side-surface conductor 314 and the end-surface conductors 318 and 320 can further be reduced or prevented.

It is preferable to provide the plurality of inner conductors in the multilayer body so that the total thickness of the plurality of inner conductors is larger than the total thickness of the resin base-material layers in a portion opposing the inner conductors in the thickness direction (that is, becomes at or above 50% of the thickness of the multilayer body). Accordingly, peeling of the side-surface conductor can further be reduced or prevented.

Similarly to Preferred Embodiment 1 described above, also in Preferred Embodiment 2 as described above, in the resin multilayer substrate 310 which is formed by laminating the plurality of resin base-material layers and includes the side-surface conductor 314 on the side surface 312a of the multilayer body 312, peeling of the side-surface conductor 314 from the side surface 312a due to the thermal expansion of the resin base-material layers can be reduced or prevented.

Preferred Embodiment 3

Preferred embodiment 3 of the present invention is different from Preferred Embodiment 1 described above in terms of a method for forming a multilayer body. Therefore, Preferred Embodiment 3 will be described focusing on the different points.

Figure 10:
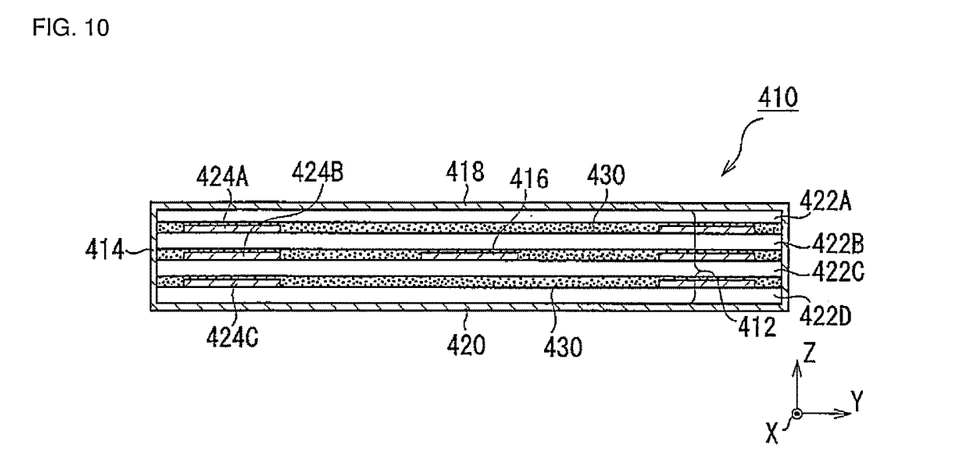
FIG. 10 is a sectional view of a resin multilayer substrate according to Preferred Embodiment 3 of the present invention.

FIG. 10 is a sectional view of a resin multilayer substrate according to Preferred Embodiment 3 of the present invention.

As illustrated in FIG. 10, a resin multilayer substrate 410 according to Preferred Embodiment 3 includes a multilayer body 412 formed by laminating a plurality of resin base-material layers, a side-surface conductor 414 provided on a side surface of the multilayer body 412, a circuit conductor 416 provided in the multilayer body 412 and defining a circuit, and end-surface conductors 418 and 420 respectively provided on both end surfaces of the multilayer body 412 in the thickness direction (Z-axis direction).

Further, inner conductors 424A to 424C different from the circuit conductor 416 are provided in the multilayer body 412.

In Preferred Embodiment 3, the multilayer body 412 includes a plurality of resin base-material layers 422A to 422D and adhesive layers 430 each located between resin base-material layers adjacent to each other. That is, different from the plurality of resin base-material layers 22A to 22E in Preferred Embodiment 1 described above, the plurality of resin base-material layers 422A to 422D are indirectly attached together using the adhesive layer (adhesive) 430. The adhesive layer 430 is an adhesive with a low coefficient of thermal expansion in the thickness direction (Z-axis direction) (for example, an adhesive including a fluoropolymer).

Due to the adhesive layer 430, in the range of the multilayer body 412 near the side-surface conductor 414, the volume fraction of the resin base-material layers further decreases, thus the thermal expansion of the multilayer body 412 is further reduced or prevented.

Similarly to Preferred Embodiment 1 described above, also in Preferred Embodiment 3 as described above, in the resin multilayer substrate 410 which is formed by laminating the plurality of resin base-material layers and includes the side-surface conductor 414 on the side surface of the multilayer body 412, peeling of the side-surface conductor 414 from the side surface due to the thermal expansion of the resin base-material layers can be reduced or prevented.

Although the present invention has been described above with reference to the plurality of Preferred Embodiments 1 to 3, the preferred embodiments of the present invention are not limited thereto.

For example, in Preferred Embodiment 1 described above, as illustrated in FIG. 3, the end-surface conductors 18 and 20 are respectively provided on both end surfaces 12b and 12c of the multilayer body 12. However, the preferred embodiments of the present invention are not limited thereto. The preferred embodiments of the present invention also include a resin multilayer substrate where at least one of the end-surface conductors 18 and 20 does not exist.

Further, in Preferred Embodiment 1 described above, as illustrated in FIGS. 2 and 3, the side-surface conductor 14 is provided over the entire or substantially the entire side surface 12a of the multilayer body 12. However, the preferred embodiments of the present invention are not limited thereto. The side-surface conductor 14 may be provided only to a portion of the side surface 12a of the multilayer body 12.

Further, in Preferred Embodiment 1 described above, as illustrated in FIG. 3, the circuit conductor 16 which transmits high-frequency signals is provided inside the multilayer body 12, as the circuit component defining the circuit. However, the circuit component in the preferred embodiments of the present invention is not limited thereto. For example, the circuit component may be a microprocessor chip, a capacitor, or the like. The circuit component in the preferred embodiments of the present invention may be any circuit component, as long as the circuit component is not electrically connected to the inner conductor which is a dummy conductor or a ground potential is applied thereto by the inner conductor which is a ground conductor.

That is, in a broad sense, the resin multilayer substrate according to the preferred embodiments of the present invention includes the multilayer body including the plurality of resin base-material layers laminated in the thickness direction, the side-surface conductor on at least a portion of the side surface of the multilayer body and made of the metallic material with the coefficient of thermal expansion whose difference from the coefficient of thermal expansion of the resin base-material layers in the plane direction is smaller than a difference from the coefficient of thermal expansion of the resin base-material layers in the thickness direction, the circuit component in the multilayer body and defining the circuit, and the plurality of inner conductors in the multilayer body and located between the side-surface conductor and the circuit component along the side-surface conductor, and at least partially overlapping each other when viewed in the thickness direction, each inner conductor being one of the dummy conductor and the ground conductor.

Although the present invention has been described above with reference to the plurality of preferred embodiments, it is understood by persons skilled in the art that preferred embodiments can be entirely or partially combined with at least another preferred embodiment to achieve still another preferred embodiment according to the present invention.

Preferred embodiments of the present invention are applicable to a resin multilayer substrate formed by laminating a plurality of resin base-material layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
a multilayer body including a plurality of resin base-material layers laminated in a thickness direction;
a side-surface conductor on at least a portion of a side surface of the multilayer body and made of a metallic material with a coefficient of thermal expansion whose difference from a coefficient of thermal expansion of the plurality of resin base-material layers in a plane direction is smaller than a difference from a coefficient of thermal expansion of the plurality of resin base-material layers in the thickness direction;
a circuit component in the multilayer body and defining a circuit; and
a plurality of inner conductors in the multilayer body, located between the side-surface conductor and the circuit component along the side-surface conductor and at least partially overlapping each other when viewed in the thickness direction, each of the plurality of inner conductors being one of a dummy conductor or a ground conductor.

2. The resin multilayer substrate according to claim 1, wherein in a direction in which the inner conductors oppose the side-surface conductor, a distance between the inner conductors and the side-surface conductor is smaller than a size of the inner conductor.

3. The resin multilayer substrate according to claim 1, wherein the plurality of inner conductors are arranged plane-symmetrically with respect to a plane parallel or substantially parallel to the plane direction and passing through a center or approximate center of the multilayer body in the thickness direction.

4. The resin multilayer substrate according to claim 1, further comprising an end-surface conductor on at least one of end surfaces of the multilayer body in the thickness direction and connected to the side-surface conductor.

5. The resin multilayer substrate according to claim 4, wherein among the plurality of inner conductors, a thickness of an inner conductor closest to the end-surface conductor is larger than a thickness of another inner conductor.

6. The resin multilayer substrate according to claim 5, wherein a total thickness of the plurality of inner conductors is larger than a total thickness of the plurality of resin base-material layers in a portion opposing the plurality of inner conductors in the thickness direction.

7. The resin multilayer substrate according to claim 1, wherein the multilayer body includes an adhesive layer between resin base-material layers of the plurality of resin base-material layers adjacent to each other and includes a fluoropolymer.

8. The resin multilayer substrate according to claim 1, wherein the plurality of resin base-material layers are made of a thermoplastic resin including a liquid crystal polymer resin.

9. The resin multilayer substrate according to claim 1, wherein the circuit is a high-frequency circuit.

10. The resin multilayer substrate according to claim 1, wherein each of the plurality of resin-material layers has a same or substantially a same thickness.

11. The resin multilayer substrate according to claim 1, wherein the plurality of resin-material layers have different thicknesses.

12. The resin multilayer substrate according to claim 1, wherein each of the plurality of inner conductors include a copper foil.

13. The resin multilayer substrate according to claim 1, wherein the circuit component is a circuit conductor.

14. The resin multilayer substrate according to claim 13, wherein the circuit conductor is a signal line.

15. The resin multilayer substrate according to claim 13, wherein the side-surface conductor is provided on an entire or substantially an entire portion of the side surface of the multilayer body.

16. The resin multilayer substrate according to claim 1, wherein each of the plurality of inner conductors is a dummy conductor.

17. The resin multilayer substrate according to claim 1, wherein each of the plurality of inner conductors is a ground conductor.

* * * * *

UNITED STATES PATENT AND TRADEMARK OFFICE
CERTIFICATE OF CORRECTION

PATENT NO. : 11,751,321 B2
APPLICATION NO. : 17/863451
DATED : September 5, 2023
INVENTOR(S) : Atsushi Kasuya It is certified that error appears in the above-identified patent and that said Letters Patent is hereby corrected as shown below:

On the Title Page

In item (56) on the second page, "JP 2013-0898411 A 5/2013" should be corrected to:
--JP 2013-089841 A 5/2013--

Signed and Sealed this
Twenty-fourth Day of October, 2023

Katherine Kelly Vidal
*Director of the United States Patent and Trademark Office*